United States Patent [19]

Akgun et al.

[11] Patent Number: 5,596,303
[45] Date of Patent: Jan. 21, 1997

[54] SUPERCONDUCTIVE MAGNET SYSTEM WITH LOW AND HIGH TEMPERATURE SUPERCONDUCTORS

[76] Inventors: Ali Akgun, 43 Royal Crest Dr., #5, North Andover, Mass. 01845; Michael M. Kerber, 6 Gristone Rd., Chelmsford, Mass. 01824

[21] Appl. No.: 20,788

[22] Filed: Feb. 22, 1993

[51] Int. Cl.[6] .................. H01F 1/00; H01F 5/00; H01F 6/00; G01V 3/00
[52] U.S. Cl. .................. 335/216; 335/299; 324/320; 505/211; 505/879
[58] Field of Search .................. 335/216; 505/704, 505/705; 324/319, 320

[56] References Cited

U.S. PATENT DOCUMENTS

| | | | |
|---|---|---|---|
| 4,412,195 | 10/1983 | Kuroda | 335/216 |
| 4,701,736 | 10/1987 | McDougall | 335/299 |
| 4,876,510 | 10/1989 | Siebold et al. | |
| 4,881,035 | 11/1989 | Siebold | 324/320 |
| 4,931,735 | 6/1990 | Overweg | 324/318 |
| 4,968,961 | 11/1990 | Miyajima | 335/216 |
| 5,138,383 | 8/1992 | Shiga | 335/216 |
| 5,179,338 | 1/1993 | Laskaris | 324/318 |
| 5,194,810 | 3/1993 | Breneman | 324/319 |

FOREIGN PATENT DOCUMENTS

3-208309  9/1991  Japan.

*Primary Examiner*—Leo P. Picard
*Assistant Examiner*—Stephen T. Ryan
*Attorney, Agent, or Firm*—Thomas, Kayden, Horstemeyer & Risley

[57] ABSTRACT

A magnet structure particularly suitable for partial human body magnetic resonance imaging. A superconductive magnet assembly consisting of a plurality of axially symmetric low and/or high temperature superconductors through which currents are induced to flow. One or more of the superconductors are at locations close to the region of homogeneous field. Geometry and locations of the superconductors and current through the superconductors are such that a substantially homogenous magnetic field results in a selected region.

19 Claims, 14 Drawing Sheets

SUPERCONDUCTIVE MAGNET SYSTEM WITH LOW AND HIGH TEMPERATURE SUPERCONDUCTORS

BACKGROUND OF THE INVENTION

This invention relates to a magnet design for magnetic resonance imaging and, more specifically, to human body imaging.

For magnetic resonance imaging, a strong and substantially homogeneous magnetic field of 0.1 to 1.5 Tesla is required. Stronger magnets though more expensive are generally considered superior. Magnets with field strengths up to 4 Tesla are being experimented with. Homogeneous indicates that the Z component of the magnetic induction field B is substantially the same everywhere within the imaging volume. A typical imaging volume is 50 centimeter diameter spherical volume. However, specialty imaging magnets are now being considered with a homogeneous volume as low as 15 centimeter diameter spherical volume. A typical homogeneity requirement for the magnetic field is less than 10 parts per million.

Axial design and symmetrical coil pair magnets meeting this requirement are known in the art. U.S. Pat. No. 4,701,736 to McDougall et al. describes axial magnets while U.S. Pat. No. 4,398,150 to Barjhoux et al. describes symmetrical coil pair magnets.

Superconducting magnets of conventional design, used in whole body scanners, require the patient to be inserted in a long hollow bore in the center of the magnet. Patient encapsulation, cost and size of the magnet are significant problems with the prior art. So-called planar magnet designs have been conceived, for example, U.S. Pat. No. 4,701,736 to McDougall, describes such a magnet design, but are quite expensive in that they use a large amount of superconducting wire.

In prior art magnetic resonance imaging magnets, homogeneity has been achieved by providing a small number of very large superconducting coils in low temperature cryogenic vessels with extremely limited heat loss. The advent of high temperature superconductors, particularly yttrium-barrium2-copper3-oxygen7, and cryocoolers allows alternative magnet structures to be considered. A cryocooler is a device for removing heat from a cryogenic, fluid such as liquid helium or liquid nitrogen.

There is a broad demand for special purpose magnetic resonance imaging systems that can be placed in doctors' offices and small clinics. However, the cost size, weight and fringe field of the magnet component of currently available magnetic resonance imaging systems have precluded this.

SUMMARY OF THE INVENTION

Briefly, in accordance with the invention, a plurality of close in superconducting correction coils or high temperature superconductive correction rings are provided which correct the inhomogeneities of the magnetic field produced by those coils which produce the bulk of the magnetic field. Close in is defined to mean close to an external surface of the magnet or close to the area of homogeneous field produced by the magnet, closer than was generally the case in those prior art magnets using helium and nitrogen boil off as the means for cooling the superconducting materials. The axial spacing, radial spacing and current through these rings and coils is such that a substantially homogeneous magnetic induction field B results in a specified volume.

In accordance with one important aspect of the present invention a lower cost magnet design is achieved by placing high temperature superconducting rings extremely close to the homogeneous volume. When a current carrying ring is placed close to the homogeneous volume its effect on field homogeneity is much more volume specific. Because of this, the magnetic field reinforcement or cancellation affect of the close in coil is much more specific. Particularly when there are cancellation fields, from current loops in the negative direction to that loop or those loops generating the bulk of the magnetic field, the close in rings or coils lead to a more efficient magnet. In some examples the close in rings or coils reduce the amount of superconducting wire required in a planar type magnet by as much as half.

Also, in accordance with the present invention, a significant reduction in patient encapsulation, magnet size and weight, are achieved.

Further, in accordance with the present invention, the close in correction rings or coils are made out of conventional superconducting wire. Provisions are made to counteract the high heat loss from the thin cryogenic insulators using active means such as a cryocooler.

It is an object of the present invention to produce a low cost, low weight magnet with a homogeneous field.

It is a further object of the present invention to reduce patient encapsulation and therefore the claustrophobia that results.

It is yet another object of the present invention to reduce the amount of superconducting wire required in a magnet with a particular strength and therefore reduce the cost and the amount of stored energy that is dissipated in a magnet quench.

Still another object of the present invention is to reduce manufacturing tolerances in a superconducting magnet design by providing a freezing-in capability in the correction rings.

Yet another object of the present invention is to further reduce manufacturing problems by shaping a single correction ring or coil out of superconducting material rather than providing a number of very carefully spaced individual superconducting correction rings or coils.

Further still it is a object of the present invention to limit eddy currents in the magnet due to the gradient fields required in a magnetic resonance imaging system. Superconducting wire and materials due to their exclusion of magnetic fields, the Meissner effect, support eddy currents only to a very limited extent on their surface, and even these limited eddy currents do not decay with time. In state of the art magnetic resonance imaging systems, gradient coil sets are placed close to the inner bore of the magnet. These gradient coil sets, when operated, induce eddy currents, particularly, in the metallic magnet structure close to the inner bore. These eddy currents are undesirable and have a significant impact on the image quality produced by magnetic resonance imaging systems. In the current invention use of high temperature superconducting materials requires less metallic structure in the vicinity of the inner bore of the magnet. With less metallic structure, fewer eddy currents are induced by the time varying gradient magnetic fields, and the imaging problems caused by these eddy currents are greatly reduced.

Still another object of the present invention is to limit the size of the helium cryostat of a magnet design in order to minimize the loss of helium by boil off. Since the close in high temperature superconductor correction rings can be at liquid nitrogen temperatures, 77 degrees K, the helium cryostat, 4 degrees K, does not need to be extended to cover them.

It is yet another advantage of the present invention to limit total cryogen boil off by limiting the surface area of the magnet.

Further objects and advantages of the invention will appear in the following description of the preferred embodiment of the invention. The embodiments are specifically suited for use in human body magnetic resonance imaging. However, the invention has broader application and can be used anywhere a homogeneous magnetic field is needed.

BRIEF DESCRIPTION OF THE DRAWINGS

This invention, together with further objects and advantages thereof can be more fully understood from the following detailed description of the preferred embodiment when taken in conjunction with the accompanying drawings, in which.

DETAILED DESCRIPTION OF THE INVENTION

Figure 1:
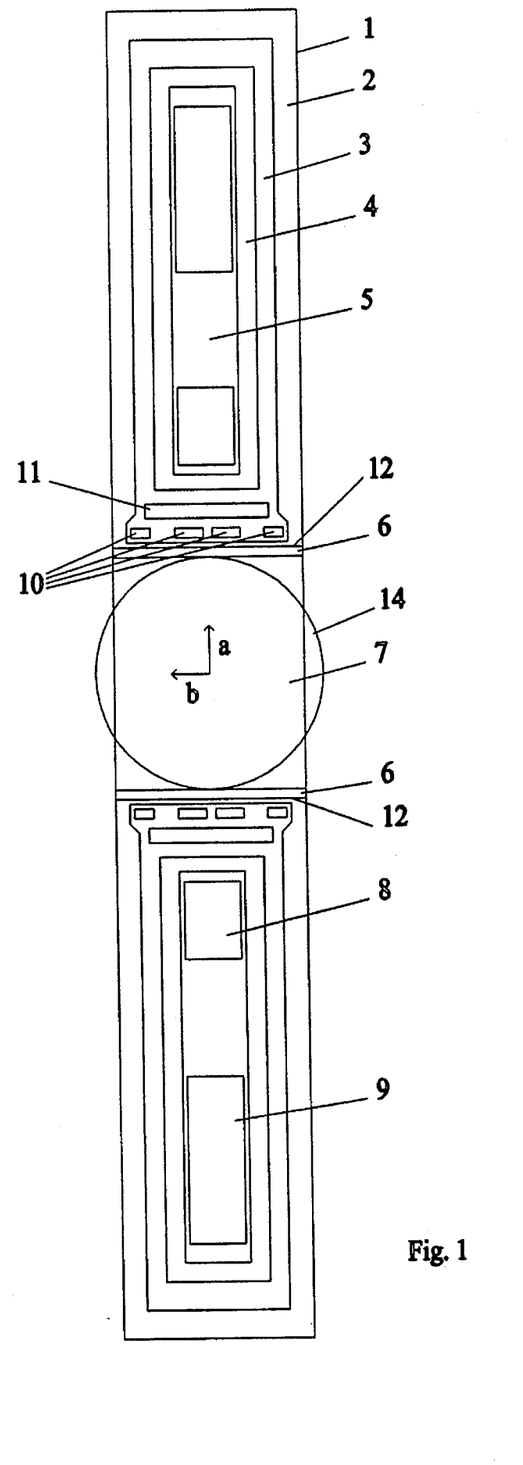
FIG. 1 is a side view in section of an axial magnet.

The present invention will be described with particular reference to a planar magnet design as diagramed in FIG. 1. Further embodiments of the invention are also described. The particular magnet design of FIG. 1 is suitable for use in a partial human body magnetic resonance imaging system. Such an imaging system could image the head, breast, and the upper and lower extremities.

Referring now to the drawings wherein the showings are for the purpose of illustrating the preferred embodiment of the invention only, and not for the purpose of limiting same, FIG. 1 is an axial or planar magnet design. A cross section of a magnet in accordance with the invention is illustrated. The conventional superconducting coils 8 and 9 are encased in a helium chamber 5 to maintain them at the low temperatures necessary for them to superconduct, approximately 4 degrees K. The helium chamber 5 is further encased in a thermal shield 4. The thermal shield 4 is enclosed in a nitrogen vessel 3. The nitrogen vessel 3 is enclosed in a vacuum chamber 2. The outside of the vacuum chamber is indicated as 1.

The high temperature superconducting rings 10 are very close to the homogeneous volume 7. They may be placed close to the inner bore of the cryostat 12 because they do not require the low temperatures of the helium cryostat 5. The axial and radial locations of the superconducting rings or coils 8, 9 and 10 are illustrated in Table 1. In the tables "a" is the radial location of the center of the conductor cross section, and "b" is the axial location of the center of the conductor cross section. All of the coils in Table 1 have a current density of 5500 amps per square centimeter of conductor cross section. In those cases where a negative current is indicated that means that the current in those loops flows in the opposite direction to the current in those loops where a positive current is indicated.

TABLE 1

| Ring Number | Radial Location a | Axial Location b | Loop Current |
| --- | --- | --- | --- |
| 9 | 0.50 m. | 0.0 m. | 586,200 Amps |
| 8 | 0.255 m. | 0.0 m. | −240,000 Amps |
| 10 | 0.145 m. | −0.0674 m. | 11,832 Amps |
| 10 | 0.145 m. | −0.0187 m. | 16,661 Amps |
| 10 | 0.145 m. | 0.0187 m. | 16,661 Amps |
| 10 | 0.145 m. | 0.0674 m. | 11,832 Amps |

The magnet design of FIG. 1 and Table 1 produces a field intensity of 0.36425 Tesla in the homogeneous imaging volume 7.

The homogeneous imaging volume 7 is within 10 parts per million over the 24 cm. diameter spherical volume 14. Said volume 14 extends two centimeters outside the limits of the cryostat. The inside surface of the cryostat 12 is an extension of the outside surface 1.

Additional shim coils or rings 11 are provided to counteract manufacturing tolerance problems and the magnetic anomalies of the imaging site. Shim coils or rings allow for small adjustments to the homogeneity of the magnetic field on the scale of 10 parts per million. Space is provided near the inside surface 12 of the cryostat for the gradient and RF coils 6.

There are two important ways of inducing current to flow in the correction rings or coils of FIG. 1. In the first method, current is induced to flow in each of the correction rings or coils independently. This method is most flexible because it allows the current in each correction coil to be different, and thus provides wider latitude in correcting field homogeneity problems. In the second method all, or pairs, of the correction rings or coils are connected in series. With the series connection, all of the rings or coils in the series carry the same current. This method is more cost effective because fewer means must be provided for inducing current to flow in the rings or coils.

Figure 2:
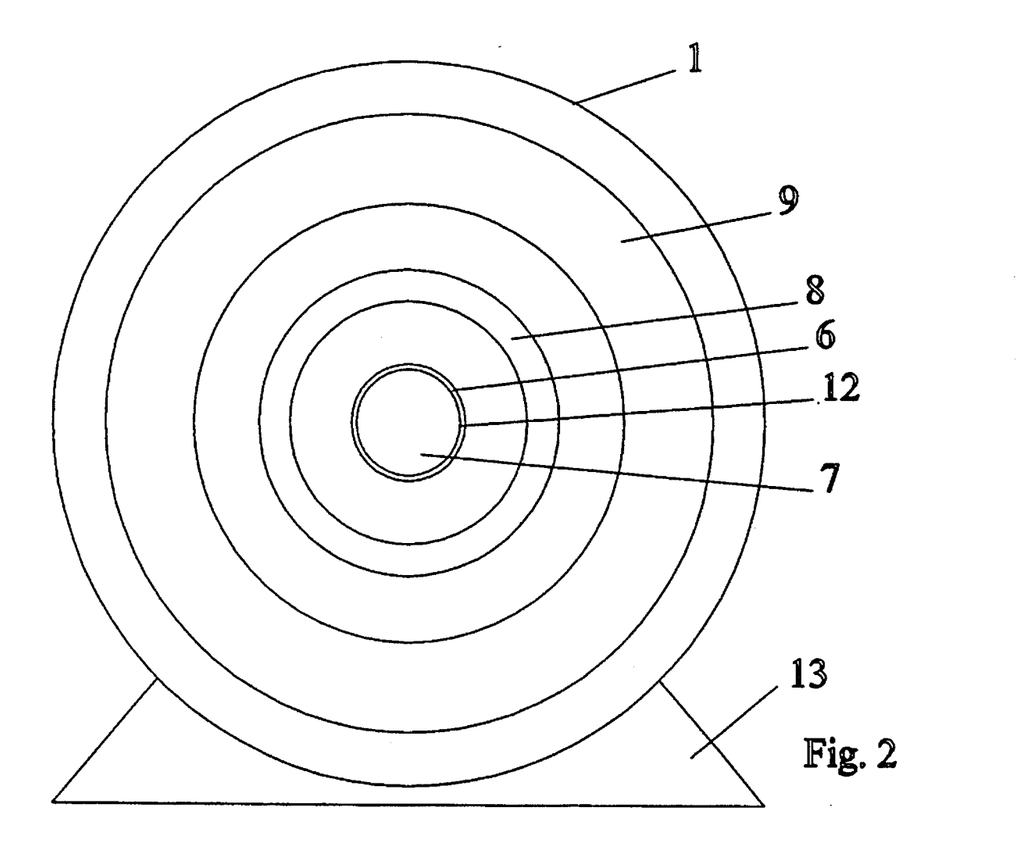
FIG. 2 is a front view in section of the magnet of FIG. 1.
Figure 3:
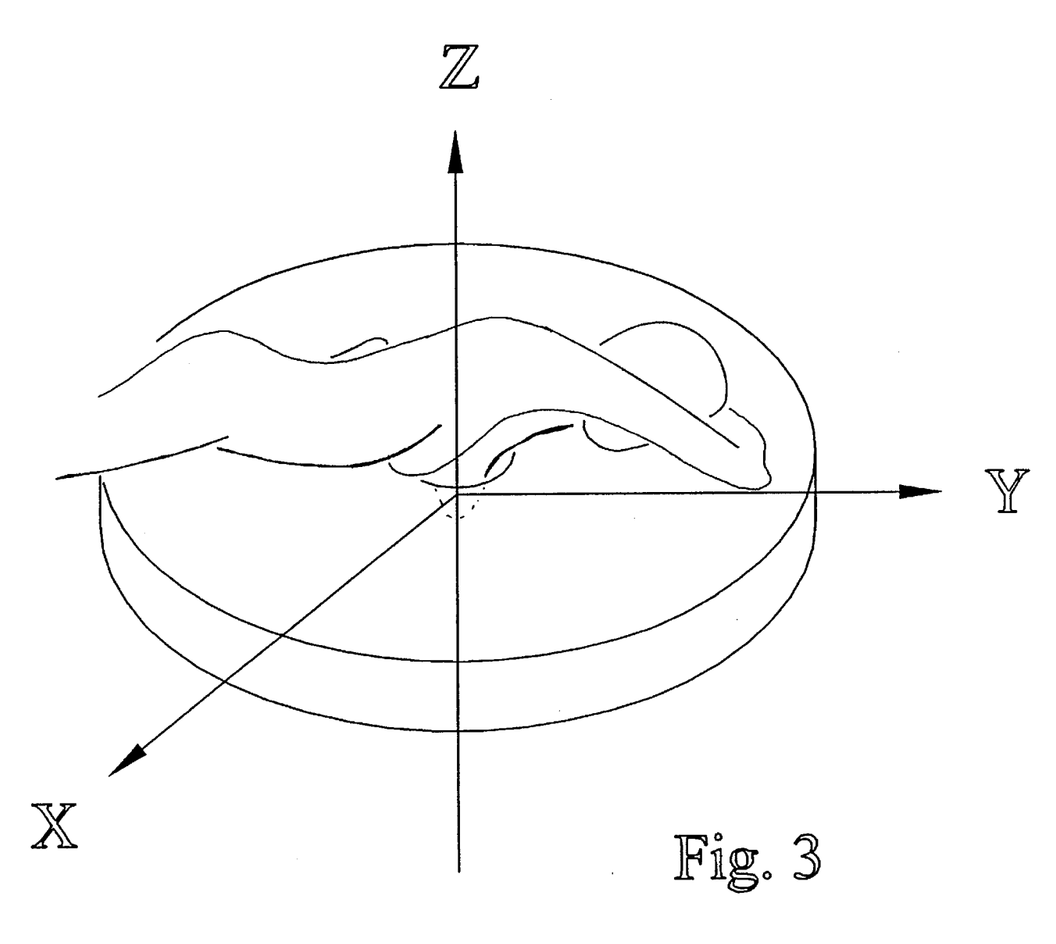
FIG. 3 is a perspective view of the magnet of FIG. 1 and FIG. 2.

Referring now to FIG. 2 a front view of the magnet of FIG. 1 is shown. The magnet is shown sited in a vertical position with base 13. Vertical siting is suitable for head scanning with the patient lying on a table or for breast scanning with the patient standing. The magnet may also be sited horizontally. Horizontal siting is suitable for breast scanning with the patient lying on top of the magnet as in FIG. 3.

Figure 4:
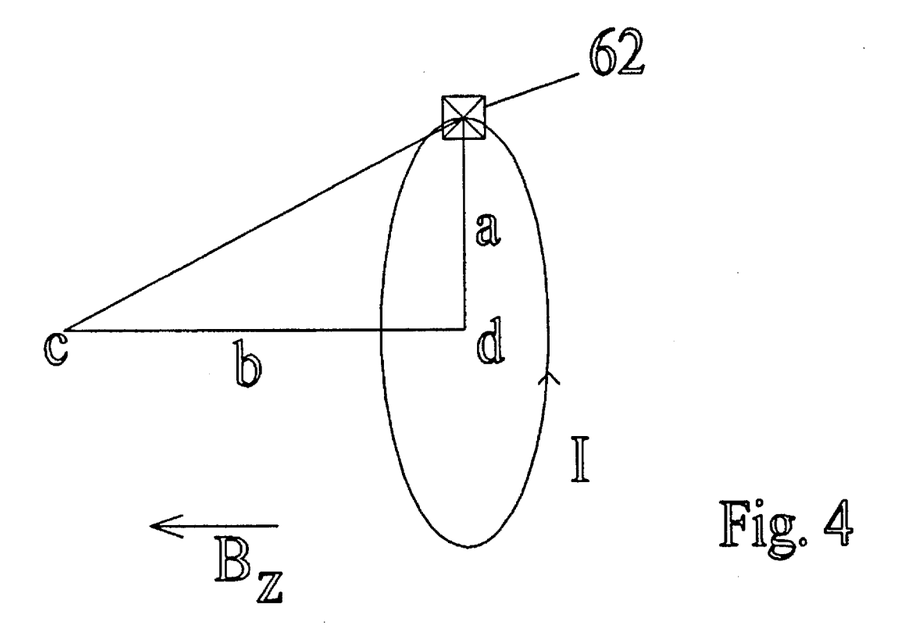
FIG. 4 is a labeled diagram of a conducting coil.

Referring now to FIG. 4 a current carrying ring or coil is shown. Dimension "a" is the radius of the ring or coil and indicates the radial distance from the center of the homogeneous area to the center of the cross section of the ring or coil. Dimension "b" is the axial distance of the ring or coil from the center of the homogenous area. Point "c" is the center of the homogeneous area. FIG. 4 should be used in conjunction with Tables 1–5 to understand the positioning of the superconducting coils. Although the following equation is not a full examination of the magnetic field in 3 dimensions, it can be used to do a rough analysis of a set of ring or coil spacings to determine feasibility before a complete analysis and optimization of a design is completed. All of the information in Tables 1–5 was analyzed using this equation. The equation is used to analyze the z component of the magnetic induction field B along the z axis of the magnet. Although a full evaluation of the magnetic induction field would take into account the width and thickness of the coils 62, the analysis in the tables takes into account only the centers of the conductor cross sections. In this equation "z" is the distance from the center "d" of the conducting loop. At any particular location "z" the contributions of all the conducting loops are summed to find the total z component of the magnetic induction field at that location.

$$B_z = u_0 \frac{I}{2} a^2 (a^2 + z^2)^{-\frac{3}{2}}$$

Figure 5:
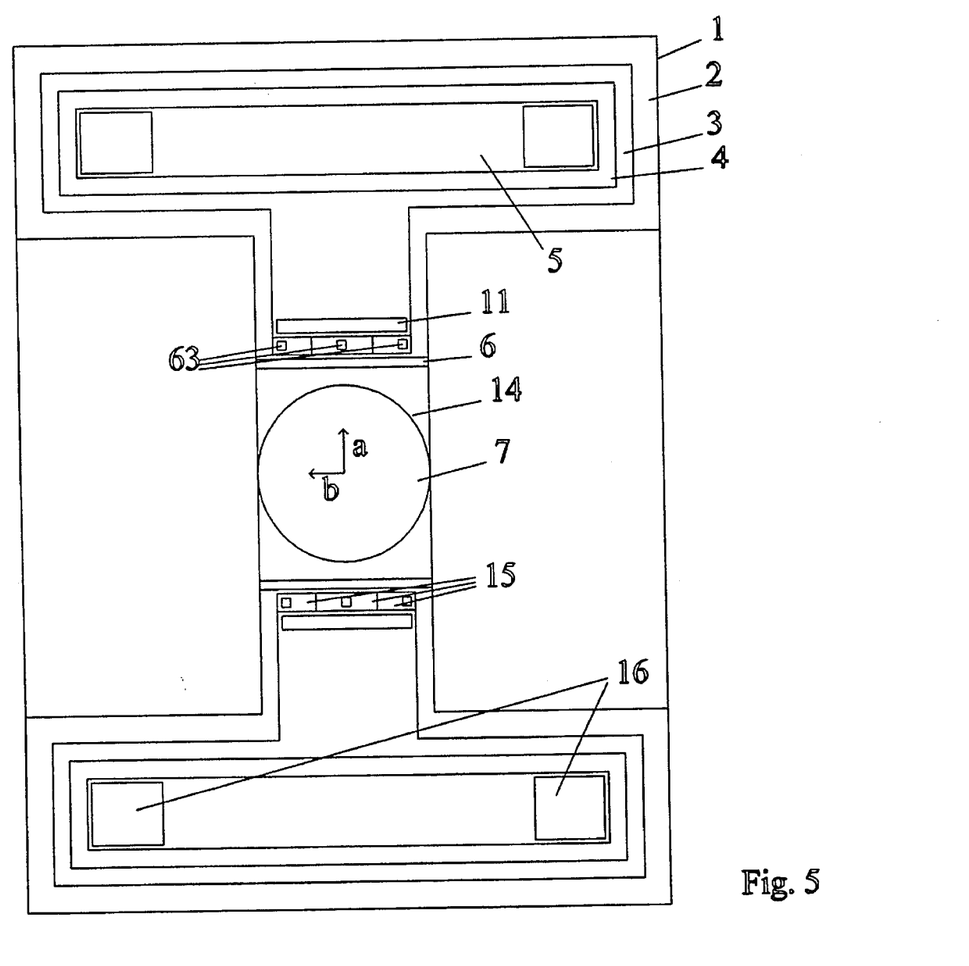
FIG. 5 is a side view in section of a coil pair magnet.

Referring now to FIG. 5, a magnet with a symmetrical coil pair is shown where the coils 16 producing the bulk of the field are spaced widely from each other. The close in high temperature superconducting correction rings or coils 63 of the present invention are shown. The homogeneous volume 7 is within 10 parts per million over the 20 cm. diameter spherical volume 14. This design is suitable for head scanning. This design is much more efficient in it's use of superconducting material than the design of FIG. 1. However, it has the attendant disadvantage of patient encapsulation and is unsuitable for breast scanning. All of the rings or coils in Table 2 have a current density of 5500 amps per square centimeter.

TABLE 2

| Ring Number | Radial Location a | Axial Location b | Loop Current |
|---|---|---|---|
| 16 | 0.385 m. | −0.255 m. | 293,000 Amps |
| 16 | 0.385 m. | 0.255 m. | 293,000 Amps |
| 63 | 0.145 m. | −0.0691 m. | 4,780 Amps |
| 63 | 0.145 m. | 0.0 m. | 5,975 Amps |
| 63 | 0.145 m. | 0.0691 m. | 4,780 Amps |

The magnet of FIG. 5 and Table 2 produces a field intensity of 0.61301 Tesla in the homogeneous imaging volume 7.

The magnetic fields generated by the correction rings or coils 63 of FIG. 5 can be frozen-in. Each correction ring or coil 63, which must be closed upon itself, is provided with its own cryogenic chamber 15. Means are provided to separately raise the temperature of each chamber 15 above or below the superconducting transition temperature of the superconducting coil within the individual chamber. In the magnet of FIG. 5 three temperature controlled chambers are provided. The freeze-in effect is discussed in U.S. Pat. No. 4,931,735 to Overweg et al. Freeze-in is accomplished by ramping the primary field coils 16 to partial strength such that the field inside a correction ring or coil 63 is at the field strength desired to be generated by said correction ring or coil. This is quite feasible since the fields generated by the correction rings or coils are always considerably smaller than the fields generated by the coils generating the bulk of the magnetic field. Once the desired field is attained, the correction ring or coil is cooled from a normal conducting state into it's superconducting state. Once the superconducting state is attained the field persists even if the field generated by those coils 16 generating the bulk of the magnetic field is changed. The coils 16 generating the bulk of the magnetic field are then ramped to two additional field settings and the fields to be generated by the other two correction rings or coils are also frozen-in. Once the fields are frozen-in the three close in correction rings or coils, the primary field coils may be ramped to their final state. Provision of a freeze-in capability substantially reduces the mechanical tolerances required of the close in correction rings or coils.

Figure 6:
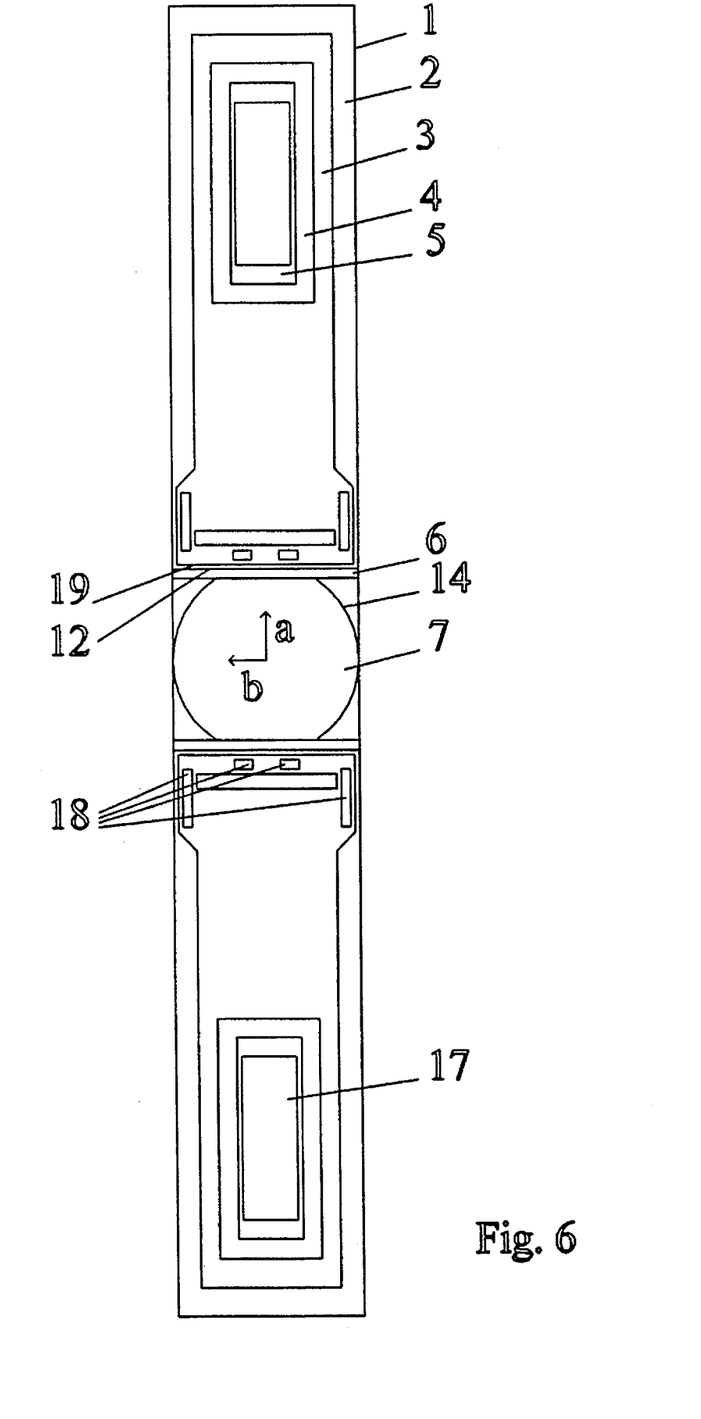
FIG. 6 is a side view in section of a second example of an axial magnet.

Referring now to FIG. 6, a magnet design similar to that of FIG. 1 is shown. An alternative placement of coils 17 generating the bulk of the field and the close in correction rings or coils 18 of the current invention is shown. The inner surface of the cryostat 12 and surface of the nitrogen vessel 19 are made of non-magnetic materials so that they will not support eddy currents. All of the rings or coils in Table 3 have a current density of 5500 amps per square centimeter of conductor cross section.

TABLE 3

| Ring Number | Radial Location a | Axial Location b | Loop Current |
|---|---|---|---|
| 17 | 0.50 m. | 0.0 m. | 586,200 Amps |
| 18 | 0.145 m. | −0.08688 m. | −20,240 Amps |
| 18 | 0.145 m. | 0.08688 m. | −20,240 Amps |
| 18 | 0.11 m. | −0.02466 m. | −7,107.5 Amps |
| 18 | 0.11 m. | 0.02466 m. | −7,107.5 Amps |

The magnet design of FIG. 6 and Table 3 produces a field intensity of 0.55685 Tesla in the homogeneous imaging volume 7 to within 10 parts per million over the 20 cm. diameter spherical volume 14.

Figure 7:
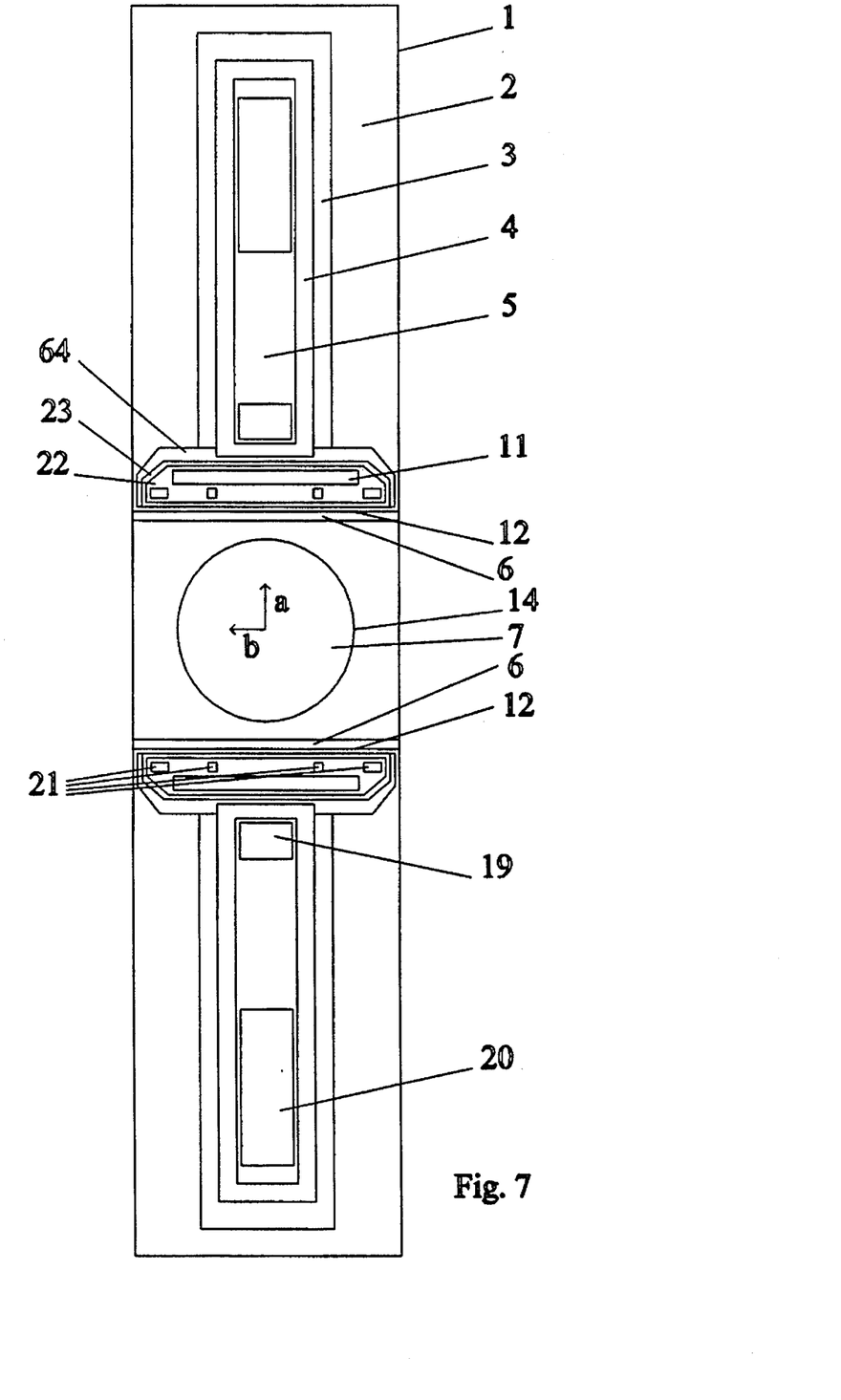
FIG. 7 is a side view in section of a third example of an axial magnet.

Referring now to FIG. 7 a magnet design similar to that of FIG. 1 is shown, however, with an alternative axial coil arrangement. The coils generating the bulk of the field 19 and 20, and the correction coils 21, are all made of conventional superconducting wire. Conventional superconducting wire is made from a thin niobium alloy coated with copper, typically less than 1 mm. in diameter. The close in correction coils 21 and shims 11 are enclosed in a separate helium chamber 22. The helium container is further enclosed in a thermal shield 23. The thermal shield 23 is further enclosed in the nitrogen chamber 64. The helium of chamber 22 is cooled with a cryocooler. Since the helium chamber surfaces only against the inside surface of the cryostat 12, heat gain is minimized. Actively cooling the helium of chamber 22 thus allows the superconducting coils to be placed close to the homogeneous area and the advantage of the invention is thus achieved. All of the coils in Table 4 have a current density of 5500 amps per square centimeter of conductor cross section.

TABLE 4

| Ring Number | Radial Location a | Axial Location b | Loop Current |
|---|---|---|---|
| 20 | 0.50 m. | 0.0 m. | 586,200 Amps |
| 19 | 0.23 m. | 0.0 m. | −74,000 Amps |
| 21 | 0.15 m. | −0.1222 m. | −10,330 Amps |
| 21 | 0.15 m. | −0.0682 m. | −4,185 Amps |
| 21 | 0.15 m. | 0.0682 m. | −4,185 Amps |
| 21 | 0.15 m. | 0.1222 m. | −10,330 Amps |

The magnet of FIG. 7 and Table 4 produces a field intensity of 0.47184 Tesla in the homogeneous imaging volume 7 to within 10 parts per million over the 20 cm. diameter spherical volume 14.

Figure 8:
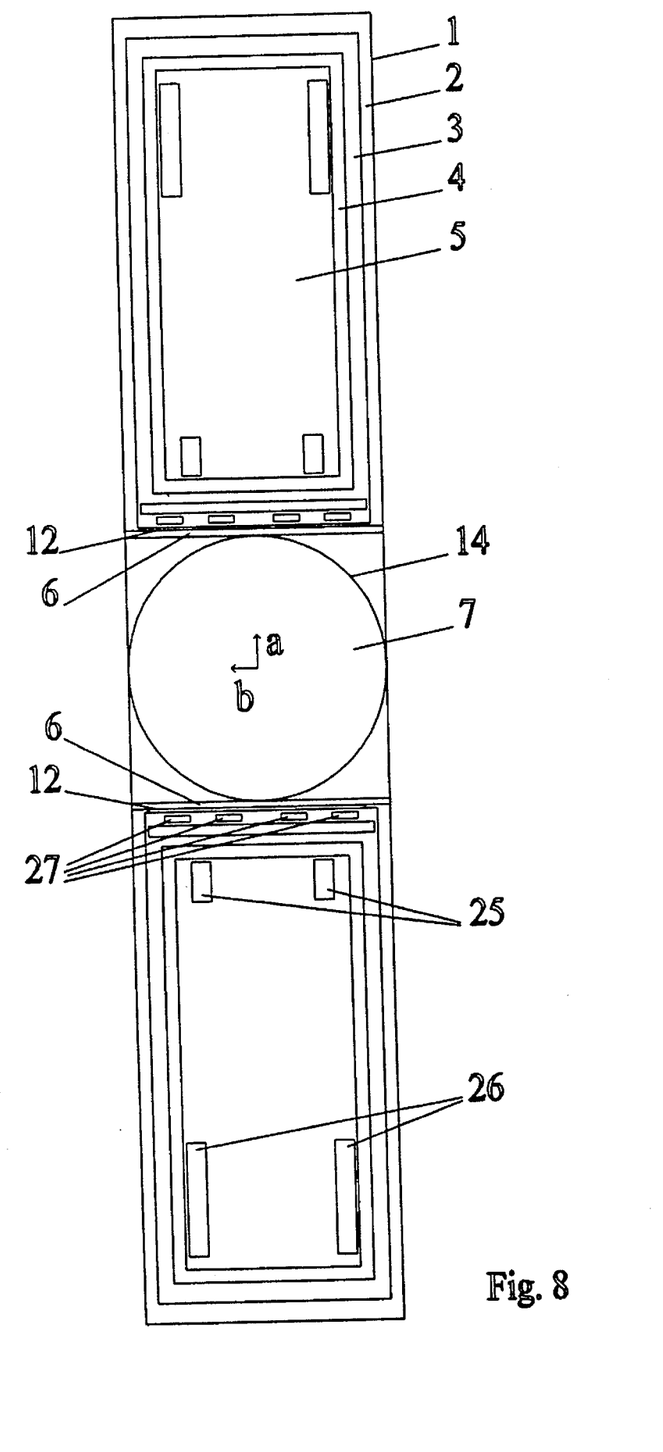
FIG. 8 is a side view in section of a second example of a coil pair magnet.

Referring now to FIG. 8 yet another arrangement of superconducting coils and rings is shown. This arrangement of coils and rings is more suitable to the larger 40 cm. diameter spherical volume of the homogeneous field produced by this magnet. The four coils 25 and 26 producing the bulk of the magnetic field are made of conventional superconducting material. The four correction rings 27 are made of a high temperature superconducting material such as yttrium-barrium2-copper3-oxygen7. All of the rings and coils in Table 5 have a current density of 5500 amps per square centimeter of conductor cross section.

TABLE 5

| Ring Number | Radial Location a | Axial Location b | Loop Current |
| --- | --- | --- | --- |
| 26 | 0.80 m. | −0.115 m. | 293,100 Amps |
| 26 | 0.80 m. | 0.115 m. | 293,100 Amps |
| 25 | 0.32 m. | −0.095 m. | −100,000 Amps |
| 25 | 0.32 m. | 0.095 m. | −100,000 Amps |
| 27 | 0.225 m. | −0.1306 m. | 17,364 Amps |
| 27 | 0.225 m. | −0.0482 m. | 19,016.5 Amps |
| 27 | 0.225 m. | 0.0482 m. | 19,016.5 Amps |
| 27 | 0.225 m. | 0.1306 m. | 17,364 Amps |

The magnet of FIG. 8 and Table 5 produces a field intensity of 0.26400 Tesla in the homogeneous imaging volume 7 to within 10 parts per million over the 40 cm. diameter spherical volume 14.

Figure 9:
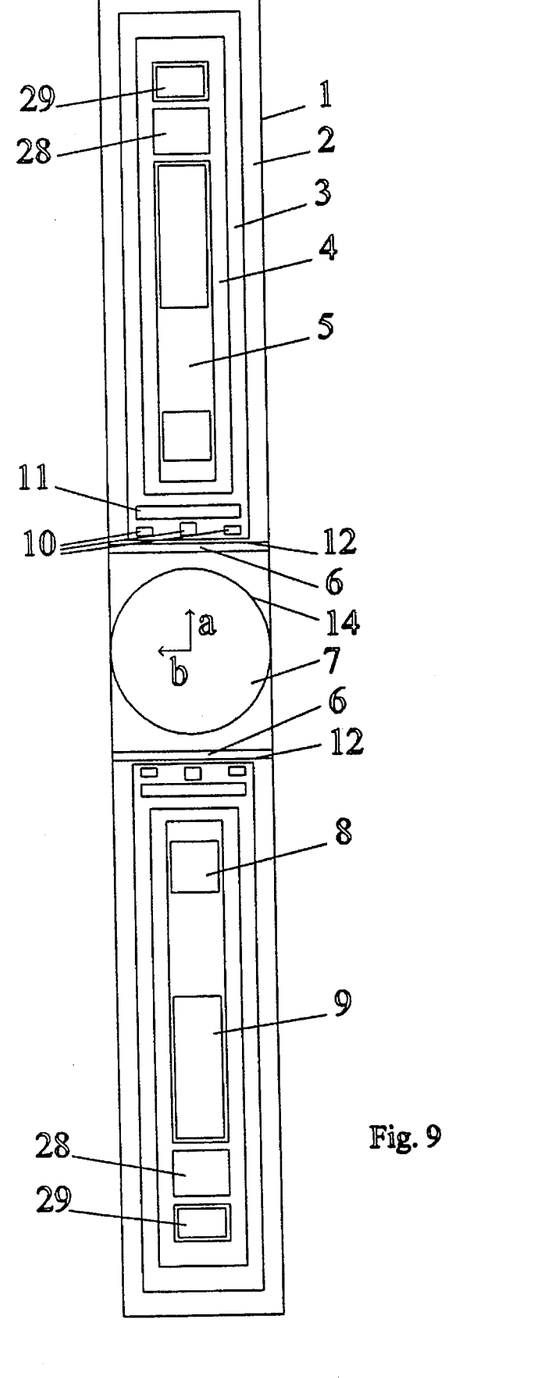
FIG. 9 is a side view in section of a fourth example of an axial magnet.

Referring now to FIG. 9 an additional magnet design similar to the design of FIG. 1 is shown. In magnets built with superconducting rings or coils the fringe magnetic field of the magnet typically extends far out from the magnet in the z direction (reference FIG. 3) and also in other directions. In magnetic resonance imaging systems sited in hospital and clinical environments it is desirable to limit the extent of the fringe field thus lowering siting costs. In FIG. 9 an active superconducting shield 29 is shown and also a passive iron shield 28 is shown. Both active and passive shields limit the extent of the fringe magnetic field. Both types of shielding may be used together or independently in a magnet design.

Figure 10:
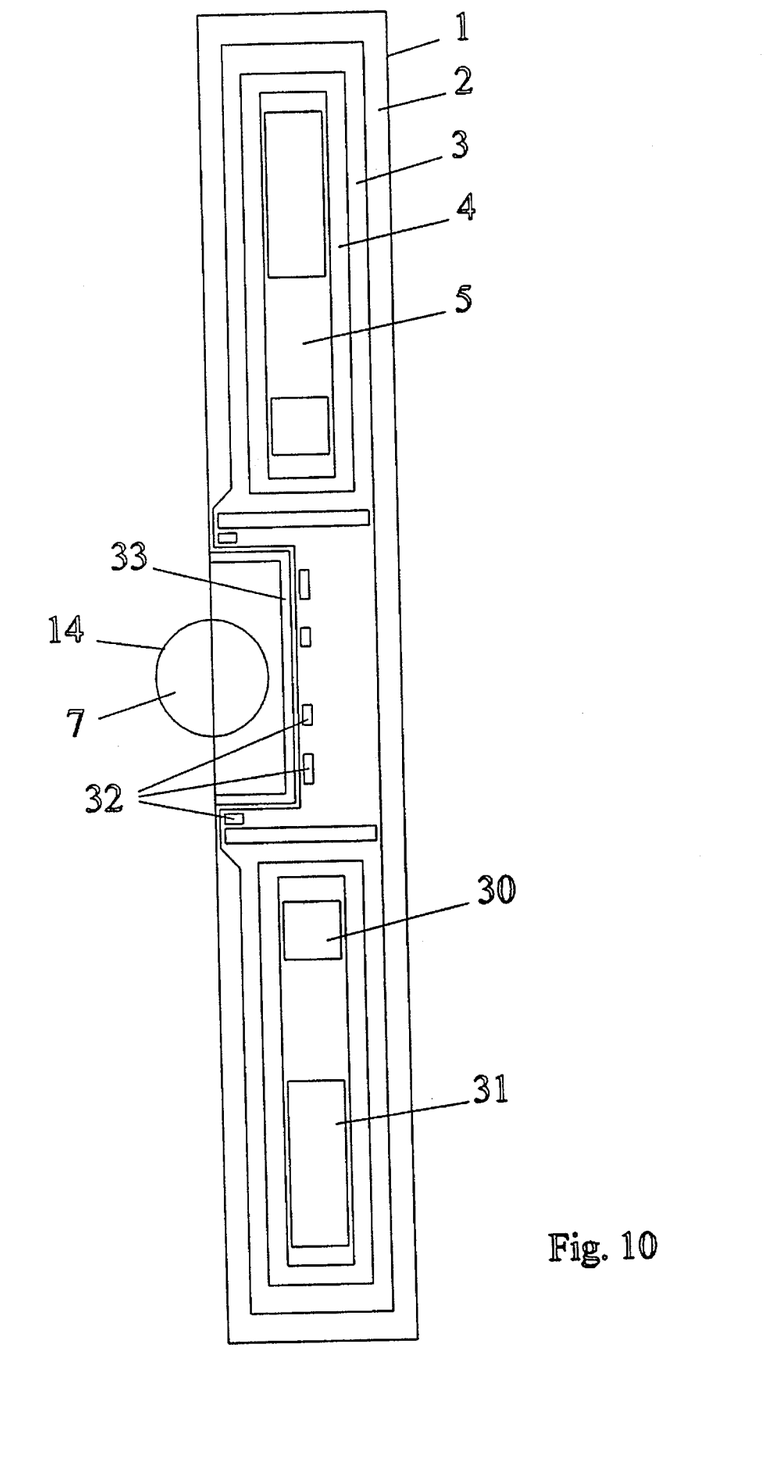
FIG. 10 is a side view in section of a fifth example of an axial magnet.

Referring now to FIG. 10 yet another magnet example is shown. Unlike in the previous magnets the homogeneous field is offset from the center of the magnet. The superconducting coils 30 and 31 generating the bulk of the field are shown, as are the close in high temperature superconducting correction rings or coils 32 of the current invention. The gradient and RF coils 33 are also shown. This design is less efficient than the previous symmetric designs. However, since the homogeneous field 7 extends further outside of the magnet, such a design is more suitable for applications such as in vivo surgery. The spherical boundary of the homogeneous region is shown as 14. This magnet would also be suitable for breast imaging.

Figure 11:
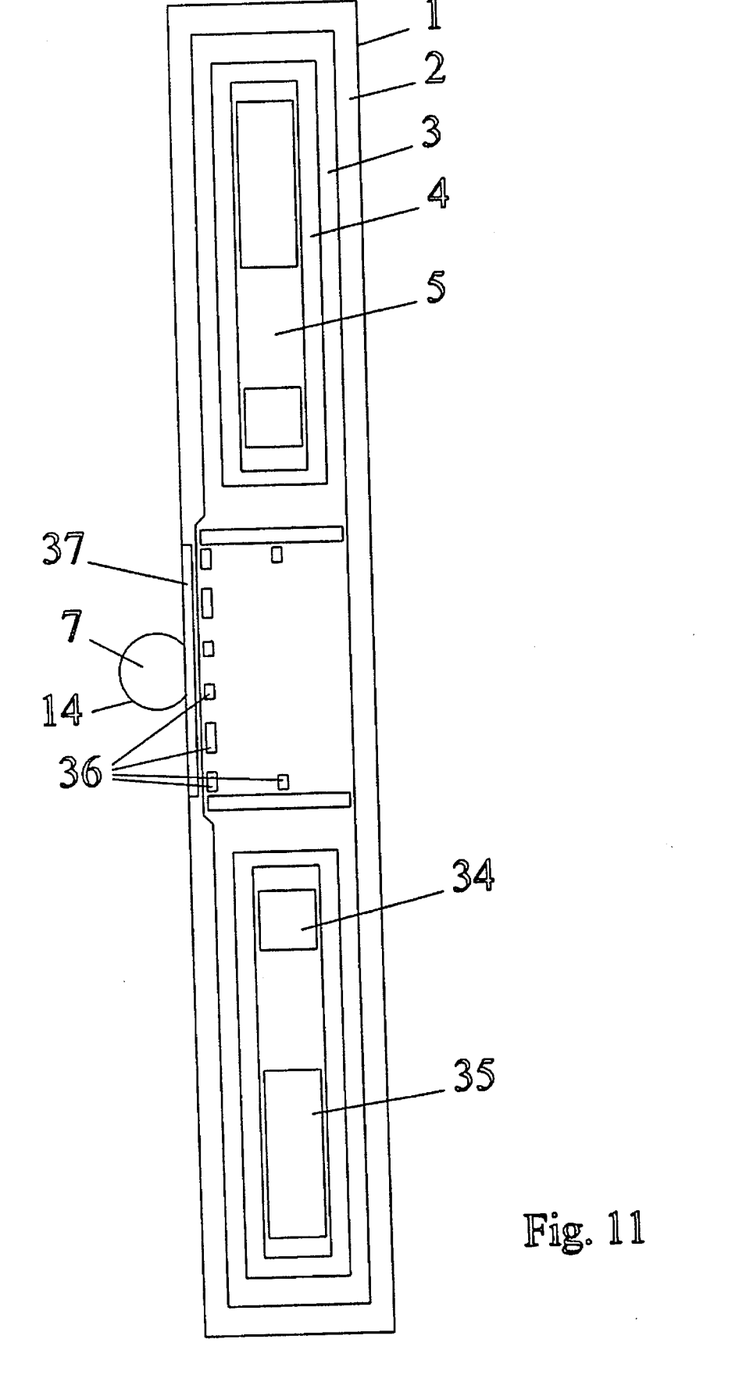
FIG. 11 is a side view in section of a sixth example of an axial magnet.

Referring now to FIG. 11 still another magnet design is shown. This design is similar to FIG. 9 with maximum projection of the homogeneous region 7 outside of the magnet. The boundary of the homogeneous region is shown as 14. The superconducting coils 34 and 35 that generate the bulk of the magnetic field are used in conjunction with the high temperature superconducting rings or coils 36 of the current invention. The gradient and RF coils 37 are also shown. In such a magnet the patient would be imaged by laying same on top of the magnet.

Figure 12:
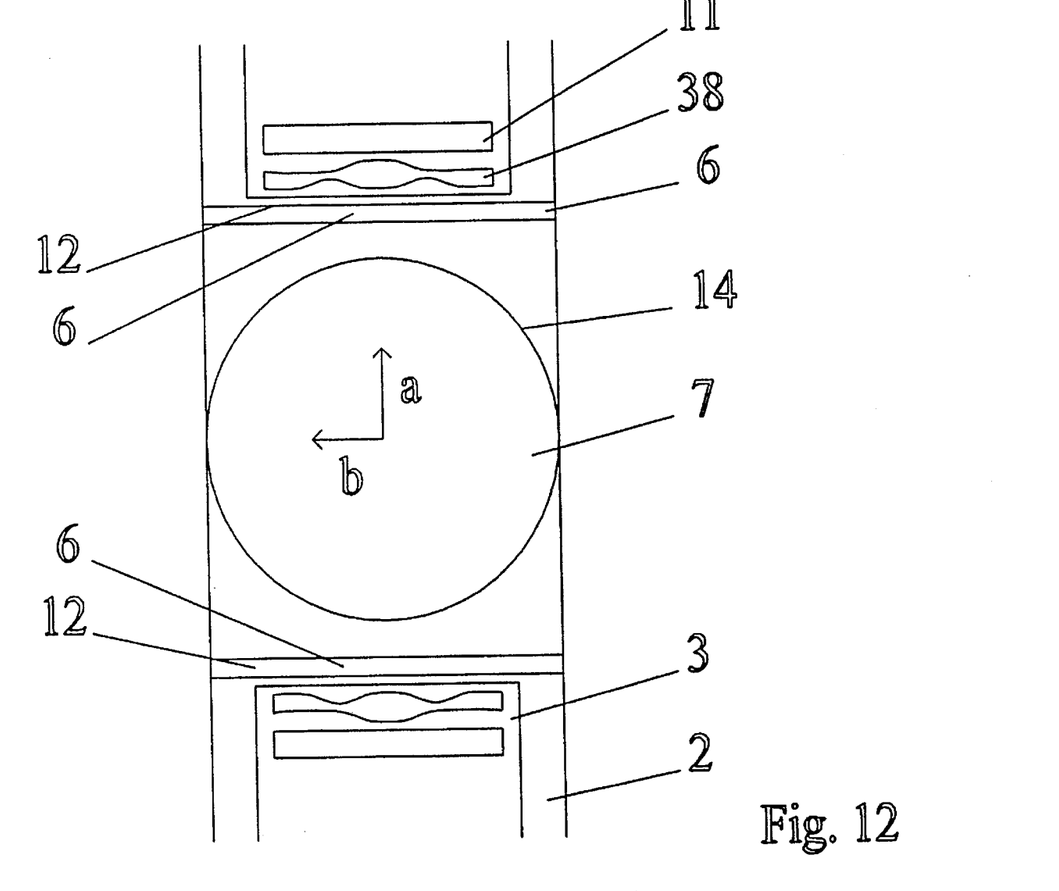
FIG. 12 is a close up side view in section limited to the center of a seventh example of an axial magnet.

Referring now to FIG. 12 a close up view of an additional magnet example is shown. Such a design would also incorporate coils such as 8 and 9 of FIG. 1 to generate the bulk of the magnetic field. Unique here is the shaped correction ring or coil 38. Only one of a number of potential shapes of the correction ring or coil is illustrated. It is also possible to have a number of shaped correction rings or coils. In FIG. 1 the spacing tolerances of the correction rings or coils 10 are very critical. Extreme manufacturing processes are required to insure proper spacing. The shaped correction coil 38 would likely be machined or molded from high temperature ceramic material. All of the tolerance requirements are then part of said process.

Figure 13:
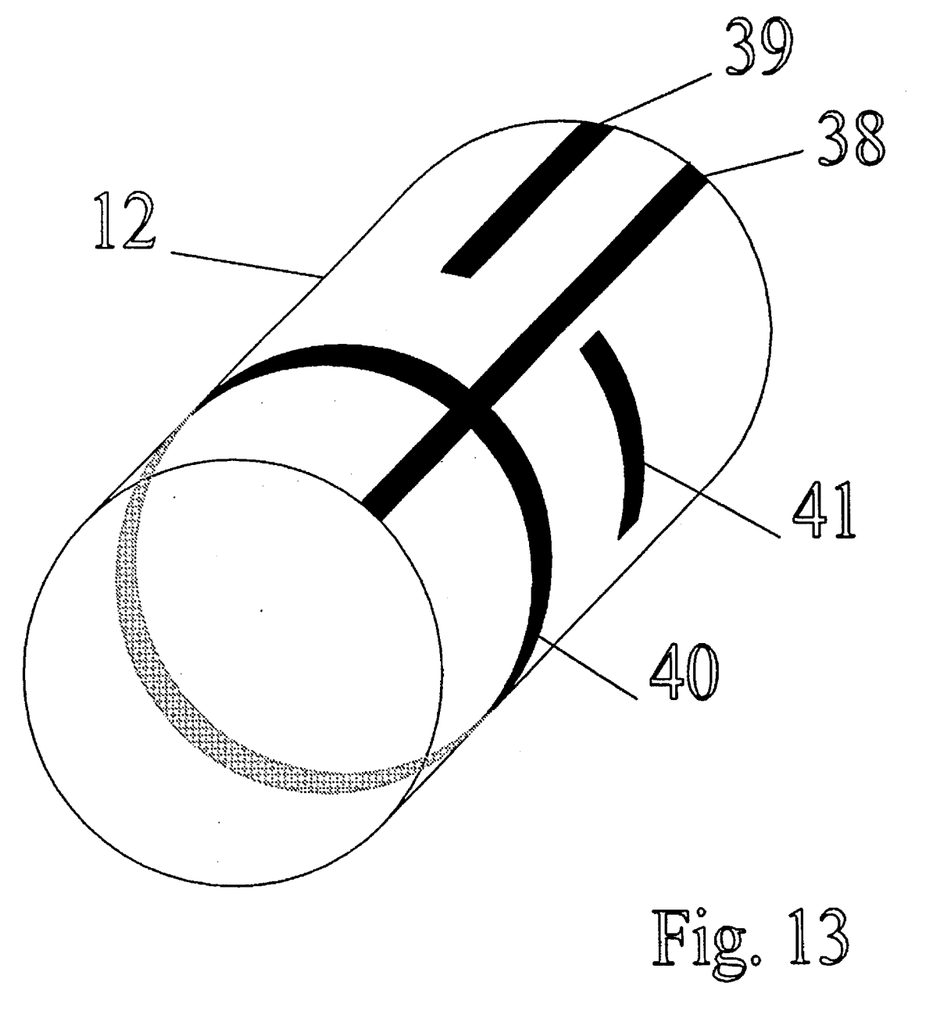
FIG. 13 is an outline view in perspective of the inner surface of a cryostat illustrating placement of passive shims.

Referring now to FIG. 13 passive shiming of a magnet is illustrated. Passive shims are used to locally modify the intensity of the magnetic field. Passive shims are placed such that a substantially homogenous magnetic induction field occurs in the homogeneous volume. Passive shims generally consist of thin strips of ferrous material, typically iron. The strips are laid axially and radially along the inside surface of a cryostat 12. The inside surfaces of the respective cryostats are indicated as 12 in FIGS. 1, 2, 6, 7 and 8. In FIG. 12 axial strips 38, partial axial strips 39, radial strips 40 and partial radial strips 41 are illustrated. Additional shapes and packets, rather than strips, of material are possible. Passive shiming can be used in conjunction with the close in superconducting correction coils of the invention to minimize the cost of a magnet.

Magnetic resonance imaging systems are able to exist because of a nuclear phenomenon called nuclear magnetic resonance, which occurs in certain nuclei, particularly Hydrogen. In the nuclear magnetic resonance experiment an atomic nuclei is excited by an RF energy pulse. The, now precessing, magnetic moment vector decays with time and returns to its original state by a process called relaxation which is generally characterized by two time-constants, T1 (spin-lattice relaxation time) and T2 (spin-spin relaxation time). Whilst the spin-lattice relaxation is equivalent to a restoration of the longitudinal component of the net magnetization vector, the spin-spin relaxation is associated with the decay of the transverse component of the magnetization. Every voxel (volume element) within the matter can be characterized by a set of MR parameters: spin-density, and time-constants T1 and T2.

For imaging with magnetic resonance, it is necessary to differentiate the spatial location of the each voxel within the volume-of interest. If the magnetic field is made slightly different at each point in the imaging volume, then each point would generate a signal with unique frequency due to the Larmor relationship when the volume of interest is excited with a relatively broad range of radio frequencies. To accomplish this, linear field gradients are superimposed on the main magnetic field. The most commonly used magnetic resonance imaging method by the commercial manufacturers is a Fourier transform based method called the two-dimensional Fourier transform method. This method produces only images of certain slices within the volume of interest by only selecting a particular slice. This is achieved by applying a tailored, selective RF pulse in combination with a field gradient.

Figure 14:
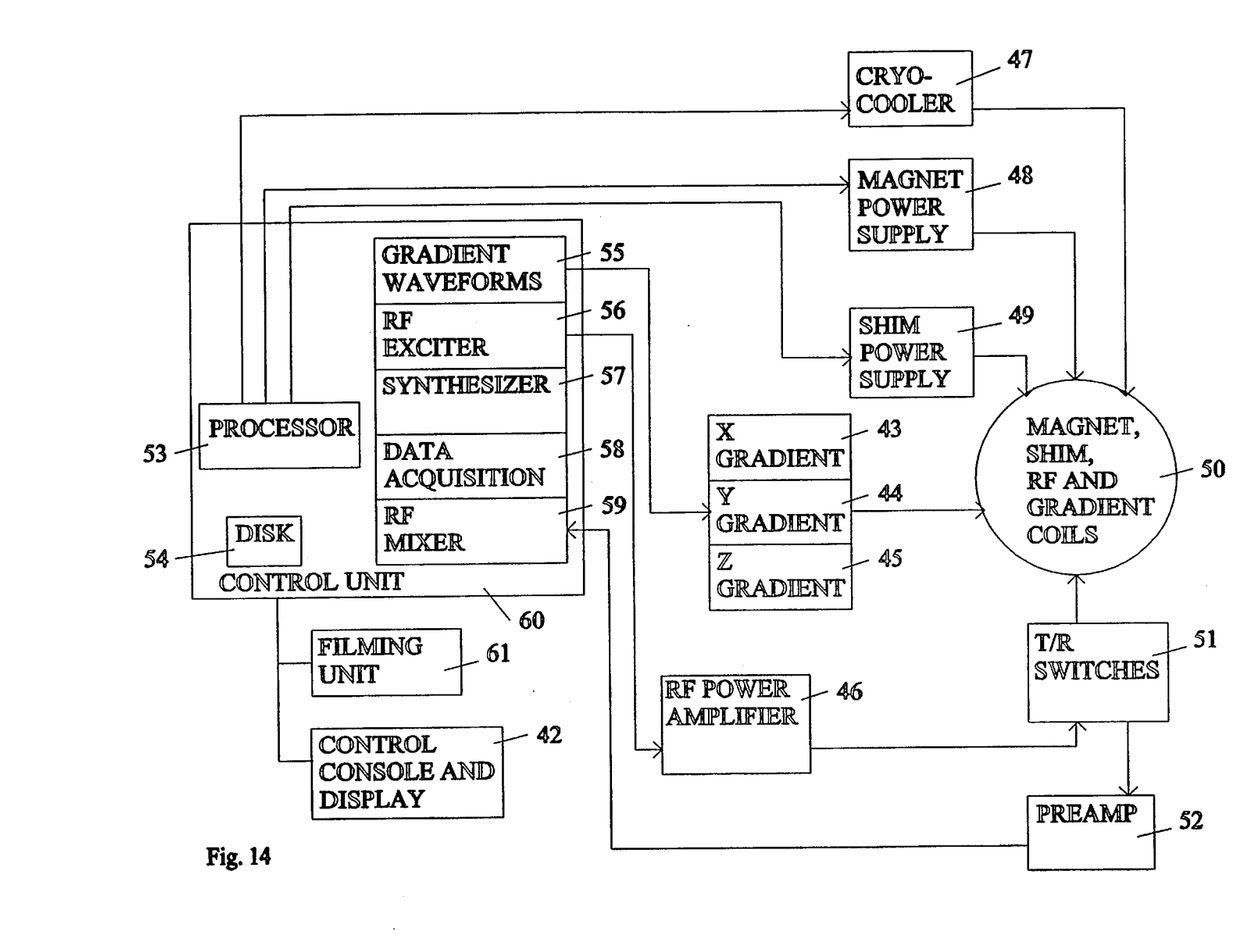
FIG. 14 is a schematic diagram of a magnetic resonance imaging system.

Referring now to FIG. 14 a schematic diagram of a magnetic resonance imaging system is shown. Other than for the magnet 50 of the present invention the magnetic resonance imaging apparatus of FIG. 14 is of conventional form.

A magnet 50 according to the present invention is shown outfitted with RF and gradient coils. The magnet power supply 48 is responsible for ramping the magnetic field of the magnet up and down, by ramping the current in the primary field coils of the magnet up and down. The shim power supply 49 adjusts the current within the shim coils thus adjusting the homogeneity of the magnet for manufacturing tolerances and inhomogeneities caused by siting the magnet. A cryocooler 47 cools helium within the magnet to eliminate boil off of helium and the attendant costs. The shim power supply 49, magnet power supply 48 and the cryocooler 47 are all under computer control 53.

The gradient magnetic fields are generated by the X, Y and Z gradient coils which are driven by the X, Y and Z (44–45) gradient amplifiers. The shapes of the gradient waveforms are generated by the gradient waveform circuits 55 which are part of the control unit 60.

RF waveforms are generated by the RF exciter 56 in conjunction with the frequency synthesizer 57. RF waveforms are passed to the RF power amplifier 46 to be amplified. The RF power passes through the transmit/receive switches 51 and then drives the RF coil, a part of the magnet system 50. Since the same coil is used to both transmit RF energy into the patient and receive the resonance signal back, the transmit/receive switch 51 is necessary to prevent the preamp 52 from overloading. The preamp 52 amplifies the resonance signal received from the patient through the rf coil. The signal amplified by the preamp 52 is mixed by the rf mixer 59 down to a frequency where it can be sampled in the data acquisition system 58 and converted into digital form for further processing in the processor 53.

The processor 53 orchestrates all of the various subsystems. Once data has been received back through the data acquisition system 58 the processor uses, typically, a 2D fourier transform to reconstruct one or more cross sectional images of the patient. Images are stored on disk 54 and also may be hardcopied on the filming unit 61. The control console and display 42 allows the operator to control the system while monitoring the patient. Images may also be displayed on the control console, both for diagnosis, and monitoring of image acquisition.

The invention has been described with reference to several embodiments. Obviously, modifications and alterations will occur to others upon the reading and understanding of this specification. It is our intention to include all such modifications and alterations insofar as they come within the scope of the appended claims or the equivalence thereof.

What is claimed is:

1. A system for producing a homogenous magnetic field within an imaging volume of a magnetic resonance imaging apparatus, comprising:

a primary coil situated about the imaging volume, said primary coil for exhibiting a primary magnetic field which contributes to the homogenous magnetic field within the imaging volume; and a correction coil situated about the imaging volume and coaxial with said primary coil, said correction coil being disposed closer to the imaging volume than said primary coil, said correction coil comprising a high temperature superconducting material, said correction coil being smaller in size than said primary coil so that said correction coil exhibits a correction magnetic field which is lesser in strength than said primary magnetic field within the imaging volume, said correction magnetic field and said primary magnetic field in combination for generating the homogenous magnetic field within the imaging volume.

2. The system of claim 1, wherein said correction coil exhibits a magnetic field strength based upon current flow which is frozen in said correction coil by said primary coil.

3. The system of claim 1, further comprising a first cooling means for cooling said primary coil with helium and a second cooling means for cooling said correction coil with nitrogen.

4. The system of claim 1, wherein said correction coil is disposed within 14 cm from the imaging volume.

5. The system of claim 1, further comprising a housing with an inner bore, said housing for enclosing said primary and correction coils, the imaging volume situated substantially within said bore.

6. The system of claim 1, wherein said correction coil is shaped.

7. The system of claim 1, further comprising a shield means for reducing a fringe field around the imaging volume.

8. The system of claim 1, wherein said primary and correction coils are interconnected so that said primary coil is in electrical series with said correction coil.

9. The system of claim 1, further comprising magnetically active material situated in close proximity to said correction coil, said magnetically active material serving as a passive correction coil.

10. The system of claim 5, wherein said correction coil is disposed within 9 cm from said inner bore.

11. The system of claim 5, wherein surfaces defining said inner bore are non-conductive materials.

12. A magnetic resonance imaging system for producing a homogenous magnetic field within an imaging volume, comprising:

a housing with an opening, the imaging volume situated substantially within said opening;

a primary coil situated within said housing about the imaging volume, said primary coil comprising a low temperature superconducting material;

a correction coil situated within said housing about the imaging volume and coaxial with said primary coil, said correction coil being disposed closer to the imaging volume than said primary coil, said correction coil comprising a high temperature superconducting material, said correction coil being smaller in size than said primary coil; and means for inducing current flow in said primary and correction coils so that said primary coil contributes to the magnetic field within the imaging volume to a greater extent than said correction coil;

whereby said primary and correction coils generate in combination the homogenous magnetic field within the imaging volume.

13. The system of claim 12, wherein said correction coil contributes to said magnetic field by an amount based upon current flow which is frozen in said correction coil by said primary coil.

14. The system of claim 12, further comprising a first cooling means for cooling said primary coil with helium and a second cooling means for cooling said correction coil with nitrogen.

15. The system of claim 12, wherein said correction coil is disposed within 14 cm from the imaging volume.

16. The system of claim 12, further comprising a shield means associated with said housing for reducing a fringe field around the imaging volume.

17. The system of claim 12, wherein said primary and correction coils are interconnected so that said primary coil is in electrical series with said correction coil.

18. The system of claim 12, wherein said correction coil is disposed within 9 cm from said opening.

19. The system of claim 12, wherein surfaces defining said opening are non-conductive materials.

* * * * *